(12) United States Patent
Kajigaya

(10) Patent No.: US 7,719,877 B2
(45) Date of Patent: May 18, 2010

(54) MEMORY CELL ARRAY AND METHOD OF CONTROLLING THE SAME

(75) Inventor: Kazuhiko Kajigaya, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 145 days.

(21) Appl. No.: 12/142,133

(22) Filed: Jun. 19, 2008

(65) Prior Publication Data
US 2008/0316839 A1 Dec. 25, 2008

(30) Foreign Application Priority Data
Jun. 21, 2007 (JP) ............................ P2007-163639

(51) Int. Cl.
*G11C 11/24* (2006.01)
(52) U.S. Cl. .................... 365/149; 365/129; 365/102
(58) Field of Classification Search ................ 365/149, 365/129, 102
See application file for complete search history.

(56) References Cited

U.S. PATENT DOCUMENTS 4,661,929 A * 4/1987 Aoki et al. .................. 365/149

FOREIGN PATENT DOCUMENTS

JP 58-048294 3/1983

JP 11-260054 9/1999

OTHER PUBLICATIONS

K. Fujishima et al., "A Storage-Node-Boosted RAM with Word-Line Delay Compensation", IEEE Journal of Solid-State Circuits, vol. SC-17, No. 5, Oct. 1982. pp. 872-876.
M. Aoki et al., "A 1.5-V DRAM for Battery-Based Applications", IEEE Journal of Solid-State Circuits, vol. 24, No. 5, Oct. 1989, pp. 1206-1212.
T. Yamaguchi et al., "High-Performance Embedded SOI DRAM Architecture for the Low-Power Supply", IEEE Journal of Solid-State Circuits, vol. 35, No. 8, Aug. 2000, pp. 1169-1178.

* cited by examiner

*Primary Examiner*—Son Dinh
*Assistant Examiner*—Nam Nguyen
(74) *Attorney, Agent, or Firm*—Young & Thompson

(57) ABSTRACT

To increase the quantity of stored charges of memory cells by a simple configuration to improve the operating margin, and to allow dummy cells to be unnecessary to improve the operating margin of a DRAM without increasing the power consumption and/or the chip area. A voltage of a common plate line is changed from a first voltage to a second voltage lower than the first voltage while a word line is a third voltage which makes the word line a selected state. The voltage of the word line is changed into a fourth voltage which makes the memory cell a non-selected state and is lower than the third voltage and higher than a fifth voltage which makes the word line a non-selected state, and the voltage of the plate line is changed into the first voltage after the voltage of the word line has been changed into the fourth voltage.

10 Claims, 8 Drawing Sheets

MEMORY CELL ARRAY AND METHOD OF CONTROLLING THE SAME

BACKGROUND OF THE INVENTION

1. Field of the Invention

The present invention relates to a memory cell array which is capable of increasing the quantity of stored charges of memory cells provided in a memory cell array of a DRAM (dynamic random access memory) by means of a simple configuration to thereby improve the operating margin of the memory cell array, and to a method of controlling such a memory cell array.

Priority is claimed on Japanese Patent Application No. 2007-163639, filed Jun. 21, 2007, the content of which is incorporated herein by reference.

2. Description of Related Art

There are known technologies to drive common electrodes (plate electrodes) of capacitors of memory cells provided in a memory cell array of a DRAM using pulses (i.e., a plate-driving scheme) to thereby substantially increase the quantity of stored charges (for example, see Patent Literatures 1 and 2, and non-Patent Literatures 1, 2, and 3).

Patent Literature 1: Japanese Unexamined Patent Application, First Publication No. S58-48294

Patent Literature 2: Japanese Unexamined Patent Application First Publication No. H 11-260054

Non-Patent Literature 1: K. Fujishima et al., "A Storage-Node-Boosted RAM with Word-Line Delay Compensation", IEEE Journal of Solid-State Circuits, Vol. SC-17, No. 5, October 1982

Non-Patent Literature 2: M. Aoki et al., "A 1.5-V DRAM for Battery-Based Applications", IEEE Journal of Solid-State Circuits, Vol. 24, No. 5, October 1989

Non-Patent Literature 3: T. Yamauchi et al., "High-Performance Embedded SOI DRAM Architecture for the Low-Power Supply", IEEE Journal of Solid-State Circuits, Vol. 35, No. 8, August 2000

In general, the use of the plate-driving scheme (which will be hereinafter simply referred to as "plate-drive") makes it possible to increase either one of the quantity of stored charges of a logic High ("H") signal and the quantity of stored charges of a logic Low ("L") signal. It is to be noted that, in the following description, the logic High ("H") will be simply referred to as "High", and the logic Low ("L") will be simply referred to as "Low" as the occasion may demand.

In related arts, a differential-input sense amplifier is used to sense the quantity of the stored charges which have been read out on a bit line and to amplify the quantity of stored charges, and thus a reference voltage is required for determining whether data which has been read out is a High data or a Low data.

Ordinarily, a reference voltage is set to the substantially middle voltage between the voltage of a bit line when a high level signal is read out thereon and the voltage of a bit line when a low level signal is read out thereon, thus ensuring the same sensing margins regardless of which data is read out. When the plate-drive is not performed, it is sufficient to use the middle voltage between the voltage of a high level signal on a bit line and the voltage of a low level signal on a bit line as a reference voltage. For example, such a reference voltage can be relatively easily generated by short-circuiting a bit line which has been amplified so as to be a high level and a bit line which has been amplified so as to be a low level.

However, when the plate-drive is performed, either the quantity of the stored charges of a high level signal or the quantity of the stored charges of a low level signal is increased. As a result, the reference voltage greatly shifts from the middle voltage. For this reason, in the related arts, dummy cells are added to generate a reference voltage.

For instance, in the related arts shown in FIG. 7 (FIG. 3 of the Patent Literature 1) and FIG. 8 (FIG. 3 of the non-Patent Literature 3), the quantity of stored charges corresponding to a Low data is increased by a plate-drive, and thus a reference voltage of a differential-input sense amplifier is adjusted by using a dummy cell such that the reference voltage is equal to a voltage which is substantially one half of the voltage when a High data is read out and the voltage when a Low data is read out.

However, there is the problem in that when dummy cells are used, current consumption for driving the dummy cells would be increased. Moreover, there is the problem in that the chip area is increased because dummy cells are disposed. Furthermore, there is the problem in that when the dummy cells become defective, the yield would be reduced because it is impossible to perform a remedy using a redundancy configuration.

SUMMARY OF THE INVENTION

The present invention has been made in view of the foregoing circumstances, and an object thereof is to provide a memory cell array which is capable of increasing the quantity of stored charges of memory cells by a simple configuration to improve the operating margin of a memory cell array provided in a DRAM, and allowing dummy cells to be unnecessary to thereby improve the operating margin of the DRAM without increasing the power consumption and/or the chip area; and a method of controlling such a memory cell array.

The present invention has been made in order to solve the foregoing problems, and a memory cell array of the present invention includes: a plurality of word lines; a plurality of bit lines intersecting the word lines; a plurality of memory cells disposed at intersecting points of the word lines and the bit lines, each of the memory cells including a select MOS transistor and an information charge storage capacitor, the select MOS transistor having a gate electrode connected to a word line, a source electrode, and a drain electrode, one of the source electrode and the drain electrode being connected to a bit line, the other of the source electrode and the drain electrode being connected to one electrode of the information charge storage capacitor, the other electrode of the information charge storage capacitor being connected to a common plate line; sense amplifiers respectively connected to the bit lines; a device which changes a voltage of the common plate line from a first voltage to a second voltage lower than the first voltage while a word line is a third voltage which makes the word line a selected state; and a device which changes a voltage of the word line into a fourth voltage which makes the memory cell a non-selected state and is lower than the third voltage and higher than a fifth voltage which makes the word line a non-selected state, and which changes the voltage of the common plate line from the second voltage to the first voltage after the voltage of the word line has been changed into the fourth voltage.

In the memory cell array of the present invention as constructed above, the voltage of the common plate line of the memory cell is changed from the first voltage to the second voltage while the word line is the third voltage which makes the word line the selected state. Thereafter, the voltage of the word line is changed into the fourth voltage which makes the memory cell the non-selected state. After the memory cell is placed in the non-selected state, the voltage of the common plate line is changed from the second voltage back to the first voltage.

The fourth voltage has a voltage level at which the select MOS transistor is placed in an OFF state when a High data is written to the information charge storage capacitor and the select MOS transistor is placed in an ON state when a Low data is written to the information charge storage capacitor.

Thus, the quantity of stored charges of the memory cells can be increased by a simple configuration, and the operating margin of the memory cell array can be improved. In addition, dummy cells can become unnecessary. For this reason, the operating margin of a DRAM can be improved without increasing the power consumption and/or the chip area. Furthermore, lowering of the yield due to defective dummy cells can be avoided.

Preferably, in the memory cell array of the present invention, a voltage of the bit line shifts between a base voltage corresponding to a Low data and a sixth voltage which corresponds to a High data, and the bit line is precharged to the base voltage before the word line is placed in a selected state.

In the memory cell array of the present invention as constructed above, the bit lines are precharged to the base voltage before a precharge termination time period (i.e., the initial time period in a read/write operation).

Thus, it is possible to read out data from the memory cell without preparing a reference voltage.

Preferably, in the memory cell array of the present invention, each of the sense amplifiers includes a first NMOS transistor having a gate electrode electrically connected to the bit line, a source electrode to which the base voltage is applied, and a drain electrode electrically connected to an output node of each of the sense amplifiers.

In the memory cell array of the present invention as constructed above, as an amplifying circuit, the first NMOS transistor is used which has the gate electrode connected to the bit line; the source electrode to which the base voltage is applied; and the drain electrode connected to the output node. In other words, the voltage of the capacitor of the memory cell which has been read out onto the bit line is inverted and amplified by the first NMOS transistor and the inverted and amplified voltage is output.

Thus, it is possible to invert and amplify data (a High data or a Low data) of the memory cell and output the inverted and amplified voltage by a simple configuration without using a reference voltage.

Preferably, in the memory cell array of the present invention, the memory cell array is one of a plurality of memory cell arrays which are arranged in a bit line direction, and output nodes of sense amplifiers corresponding to bit lines located at the same positions in a word line direction among the sense amplifiers included in each of the memory cell arrays are connected to a common global bit line.

In the memory cell array of the present invention as constructed above, the output nodes of the sense amplifiers corresponding to the bit lines located at the same position in the word line direction are connected to the common global bit line.

Thus, in the memory cell array of the present invention, it is possible to provide the outputs of the plurality of sense amplifiers through the common global bit line.

Preferably, in the memory cell array of the present invention, the global bit line is connected to a global sense amplifier which amplifies a signal on the global bit line and outputs the amplified signal to a read data line, and which amplifies a signal on a write data line and outputs the amplified signal to the global bit line.

In the memory cell array of the present invention as constructed above, each global bit line is connected to the read data line and the write data line through the global sense amplifier.

Thus, in the memory cell array of the present invention, it is possible to perform a read operation of data from a memory cell and a write operation of data into a memory cell through the global sense amplifier and the global bit line. Preferably, in the memory cell array of the present invention, the number of memory cells electrically connected to each of the bit lines is 64 or less.

Thus, in the memory cell array of the present invention, in the case where a signal read on the bit line is amplified by a single ended sense amplifier, the influence of the parasitic capacitance of the bit line can be reduced.

Preferably, in the memory cell array of the present invention, the voltage of the word line changes into the fourth voltage while the voltage of the common plate line is the second voltage, and after the voltage of the common plate line has changed into the first voltage, the voltage of the word line changes from the fourth voltage to the fifth voltage.

In the memory cell array of the present invention as constructed above, while the voltage of the common plate line is the second voltage, the voltage of the word line changes into the fourth voltage between the third voltage which makes the word line the selected state and the fifth voltage which makes the word line the non-selected state. Thereafter, the voltage of the common plate line changes into the first voltage, and then the voltage of the word line changes from the fourth voltage to the fifth voltage.

Thus, the quantity of the stored charges of the memory cells can be increased by using a simple configuration and a simple control operation. As a result, the operating margin of the memory cell array can be improved, and dummy cells can be eliminated. Therefore, it is possible to improve the operating margin of the DRAM without increasing the power consumption and/or the chip area.

Preferably, in the memory cell array of the present invention, the fifth voltage is lower than the base voltage.

Thus, even in the case where the voltage of the common plate line is changed (in the case where a plate-drive is performed), it is possible to have no influence or effect on the selected state of the select transistor connected to a word line.

Preferably, in the memory cell array of the present invention, a difference between the base voltage and the fifth voltage is equal to or larger than a difference between the first voltage and the second voltage.

Thus, even in the case where the voltage of the common plate line is changed (in the case where plate-drive is performed), it is possible to have no influence or effect on the selected state of the select transistor connected to the word line.

In accordance with a method of controlling a memory cell array of the present invention, the memory cell array includes: a plurality of word lines; a plurality of bit lines intersecting the word lines; a plurality of memory cells disposed at intersecting points of the word lines and the bit lines, each of the memory cells including a select MOS transistor and an information charge storage capacitor, the select MOS transistor having a gate electrode connected to a word line, a source electrode, and a drain electrode, one of the source electrode and the drain electrode being connected to a bit line, the other of the source electrode and the drain electrode being connected to one electrode of the information charge storage capacitor, the other electrode of the information charge storage capacitor being connected to a common plate line; and sense amplifiers respectively connected to the plurality of bit lines, and the method includes: changing a voltage of the common plate line from a first voltage to a second voltage lower than the first voltage while a word line has a third voltage which makes the word line a selected state; and changing a voltage of the word line into a fourth voltage which makes the memory cell a non-selected state and is lower than the third voltage and higher than a fifth voltage which makes the word line a non-selected state, and changing the voltage of the common plate line from the second voltage to the first voltage after the voltage of the word line has been changed into the fourth voltage.

In the method of controlling the memory cell array of the present invention which includes the foregoing steps, the voltage of the common plate line of the memory cell is changed from the first voltage to the second voltage while a word line is the third voltage which makes the word line the selected state. Thereafter, the voltage of the word line is changed into the fourth voltage which makes the memory cell the non-selected state, and the voltage of the common plate line is changed from the second voltage back to the first voltage after the memory cell is placed in the non-selected state.

Thus, the quantity of the stored charges of the memory cells can be increased by a simple configuration. As a result, the operating margin of the memory cell array can be improved, and dummy cells become unnecessary. For this reason, the operating margin of a DRAM can be improved without increasing the power consumption and/or the chip area. Furthermore, lowering of the yield due to defective dummy cells can be avoided.

As described above, in accordance with the present invention, the quantity of stored charges of memory cells can be increased by a plate-drive and a simple configuration using single ended sense amplifiers. Thus, the operating margin of the memory cell array can be improved. Moreover, dummy cells become unnecessary. For this reason, the operating margin of the DRAM can be improved without increasing the power consumption and/or the chip area. Furthermore, lowering of the yield due to defective dummy cells can be avoided.

DETAILED DESCRIPTION OF THE INVENTION

Outline

In a memory cell array of the present invention, prior to making a word line a non-selected state, the voltage of a common plate line is driven so as to change from a low level to a high level, thereby increasing the quantity of stored charges corresponding to a High data. On the other hand, in a read operation, a bit line is precharged so that the voltage thereof becomes a low level. As a result, when a Low data is read out, the voltage of the bit line does not change, while when a High data is read out, a high level voltage appears on the bit line.

Moreover, a sense amplifier having a single ended configuration is used, wherein a gate electrode of an amplifying transistor is connected to a bit line, a source electrode of the amplifying transistor is connected to a base power supply, and a drain electrode of the amplifying transistor is connected to an output of the sense amplifier. Bit line capacitance, memory cell capacitance, the amplitude of the voltage of a bit line, and the amplitude of the voltage of a plate-drive are set so that when a Low data is read out, the amplifying transistor is turned OFF, and while when a High data is read out, the amplifying transistor is turned ON.

Hereinbelow, preferred embodiments of the present invention will now be described with reference to the attached drawings.

Figure 1:
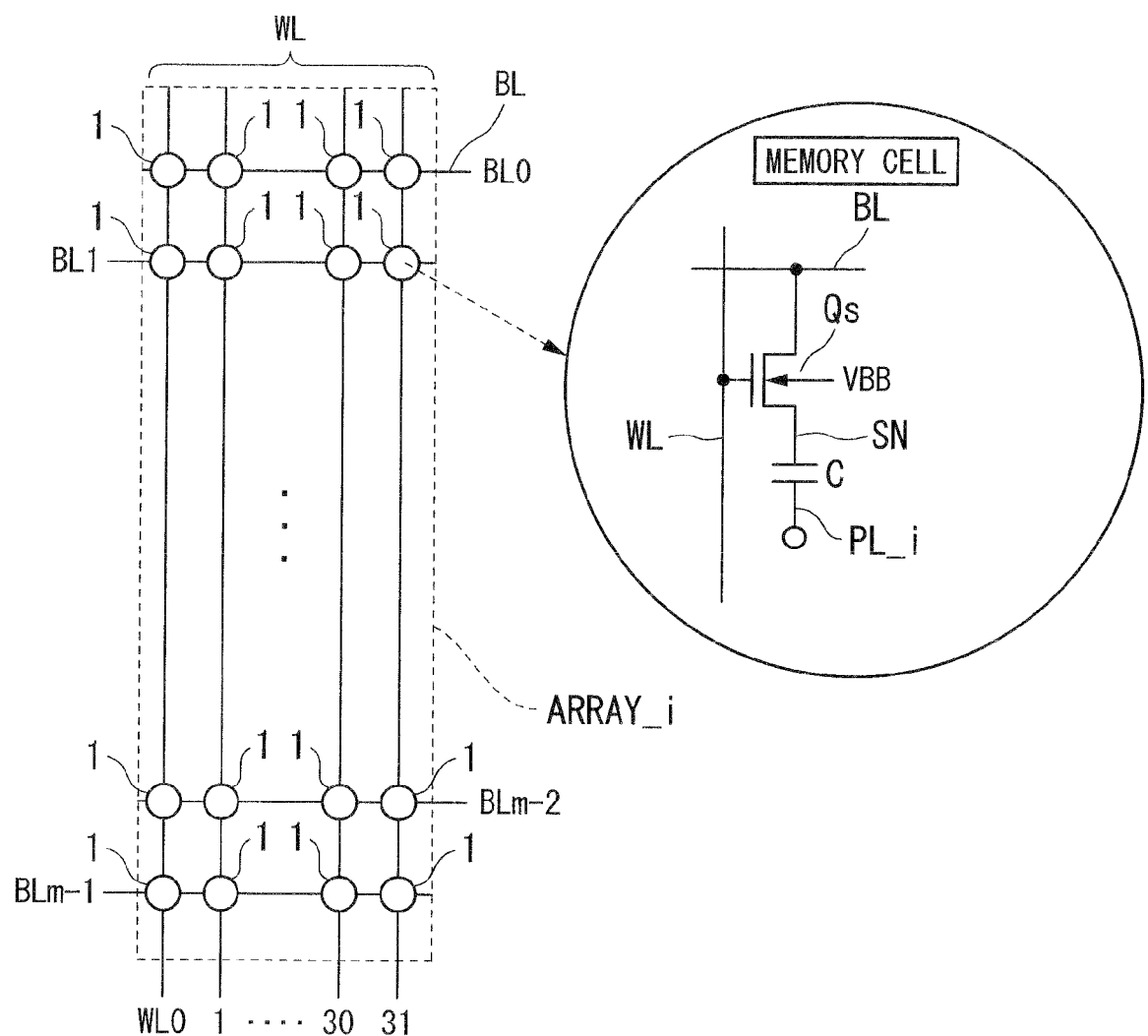
FIG. 1 is a diagram showing the circuit configuration of a memory cell array in accordance with an embodiment of the present invention.

Description of the Configuration of a Semiconductor Memory Device in Accordance with an Embodiment of the Present Invention FIG. 1 is a diagram showing the circuit configuration of a memory cell array of DRAM in accordance with the embodiment of the present invention.

In the example of a memory cell array shown in FIG. 1, 32×m number of memory cells 1 each including one select transistor Qs and one capacitor C which are connected in series are disposed at intersecting points of m number of bit lines BL (BL0, BL1, . . . , BLm−1) and 32 word lines WL (WL0, WL1, . . . , WL31).

Moreover, counter electrodes of capacitors C respectively provided in 32×m number of memory cells belonging to one memory cell array_i (ARRAY_i; a unit for driving the common plate line) are connected to a common plate line PL_i (where i is 0 or a natural number). A negative substrate voltage VBB is supplied to the substrate of the select transistor Qs. It is to be noted that, in the following description, a "common plate line" will be simply referred to as "plate line" as the occasion may demand.

Furthermore, after a word line WL has been selected, a voltage VPL of the plate line PL_i is lowered by a predetermined voltage ΔVPL. Thereafter, the voltage of the word line WL is changed into an intermediate voltage for placing the select transistor Qs in a non-selected state (this intermediate voltage will be described later as a fourth voltage). As a result, the select transistor Qs is placed in a non-selected state. Thereafter, the voltage of the plate line PL_i is changed from a voltage (VPL−ΔVPL) back to the voltage VPL to increase the quantity of stored charges of a memory cell which holds a High data (the detail will be described later).

Figure 2:
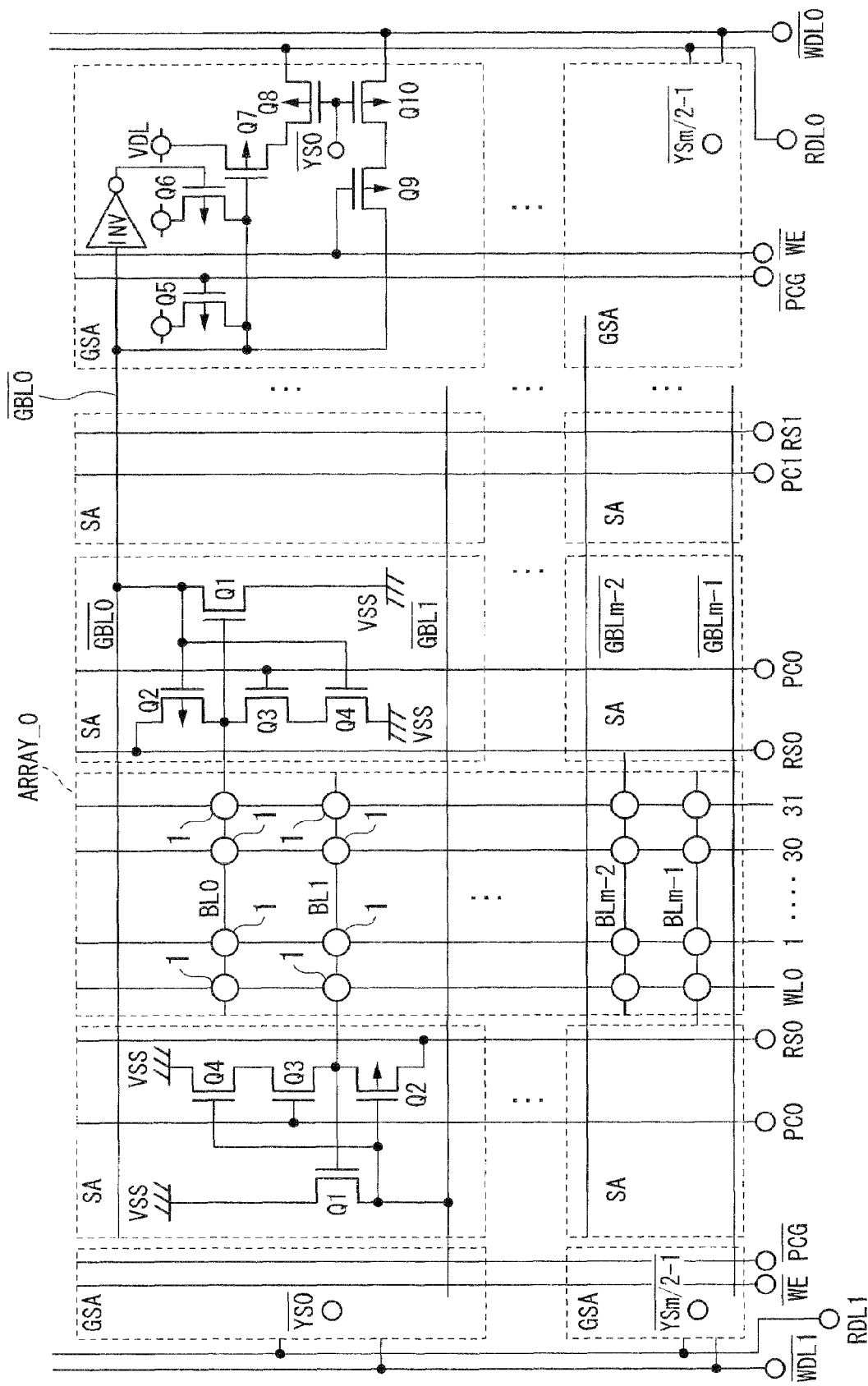
FIG. 2 is a diagram showing the entire configuration of the memory cell array in accordance with the embodiment of the present invention.

FIG. 2 is a diagram showing the entire configuration of the memory cell array in accordance with the embodiment of the present invention. As shown in FIG. 2, single ended sense amplifiers SA are disposed on both sides of the memory cell array (e.g., ARRAY_0).

In FIG. 2, bit lines BL (BL0 to BLm−1) are alternately connected to gate electrodes of amplifying transistors Q1

(NMOS transistors) in left and right sense amplifiers SA. Ground potential (base potential) VSS is applied to the source electrode of the amplifying transistor Q1, and the drain electrode of the amplifying transistor Q1 serves as an input/output node for global bit lines.

The bit line BL0 is connected to a sense amplifier drive control line RS0 corresponding to a memory cell array ARRAY_0 through a PMOS transistor Q2. Moreover, ground potential VSS is applied to the bit line BL0 through a precharge transistor Q3 (NMOS transistor) and a bit line drive transistor Q4 (NMOS transistor). When the precharge transistor Q3 and the bit line drive transistor Q4 are both turned ON, the bit line BL0 is precharged to the ground potential VSS.

It is to be noted that since a signal read on the bit line BL0 is amplified by the single ended sense amplifier, it is necessary to set the voltage of the signal thus read from a memory cell to a voltage larger than the threshold value Vt of the transistor Q1. Thus, in order to maintain the parasitic capacitance of each bit line at a small value, it is desirable that the number of memory cells connected to a single bit line be about 64 or less, and it is optimum that the number of memory cells be about 32.

Moreover, input/output nodes of sense amplifiers arranged in the bit line direction are commonly connected to a global bit line /GBL0 (sign "/" refers to a logic inversion sign), and the global bit line /GBL0 is connected to the input/output node of a global sense amplifier GSA.

The global sense amplifier GSA includes PMOS transistors Q5-Q10 and an inverter (a logic inverting element) INV.

The transistor Q5 has a drain terminal connected to the global bit line /GBL0, a source terminal to which a power supply voltage VDL is applied, and a gate terminal connected to a precharge signal line /PCG. The transistor Q5 is a transistor for precharging the global bit line /GBL to a high level. The transistor Q6 has a drain terminal connected to the global bit line /GBL0 and a source terminal to which the power supply voltage VDL is applied. A signal obtained by logically inverting a signal on the global bit line /GBL0 using the inverter INV is applied to the gate terminal of the transistor Q6. Thus, the transistor Q6 maintains the signal on the global bit line /GBL0 at a high level.

The transistor Q7 has a source terminal to which the power supply voltage VDL is applied and a gate terminal connected to the global bit line /GBL0, and serves as an inverting amplifier. The PMOS transistor Q8 is inserted between a read data line RDL0 and the transistor Q7, and undergoes ON/OFF control by a signal on a select signal line /YS0 connected to the gate terminal of the transistor Q8. The signal on the global bit line /GBL0 is inverted by the transistors Q7 and Q8, and the inverted signal thus obtained is output to the read data line RDL0.

The transistors Q9 and Q10 which are connected in series are inserted between the global bit line /GBL0 and a write data line /WDL0. The gate terminal of the transistor Q9 is connected to a control signal line /WE, and the transistor Q9 undergoes ON/OFF control by a signal on the control signal fine /WE. The gate terminal of the transistor Q10 is connected to the select signal line /YS0, and the transistor Q10 undergoes ON/OFF control by the signal on the select signal line /YS0.

As stated above, plural units each unit configured to include a single memory cell array and left and right sense amplifiers are arranged repeatedly in the bit line direction, and global sense amplifiers GSA are disposed on both sides thereof, thereby constituting a single memory bank.

Explanation of the Operation of the Memory Cell Array Shown in FIG. 2

Figure 3:
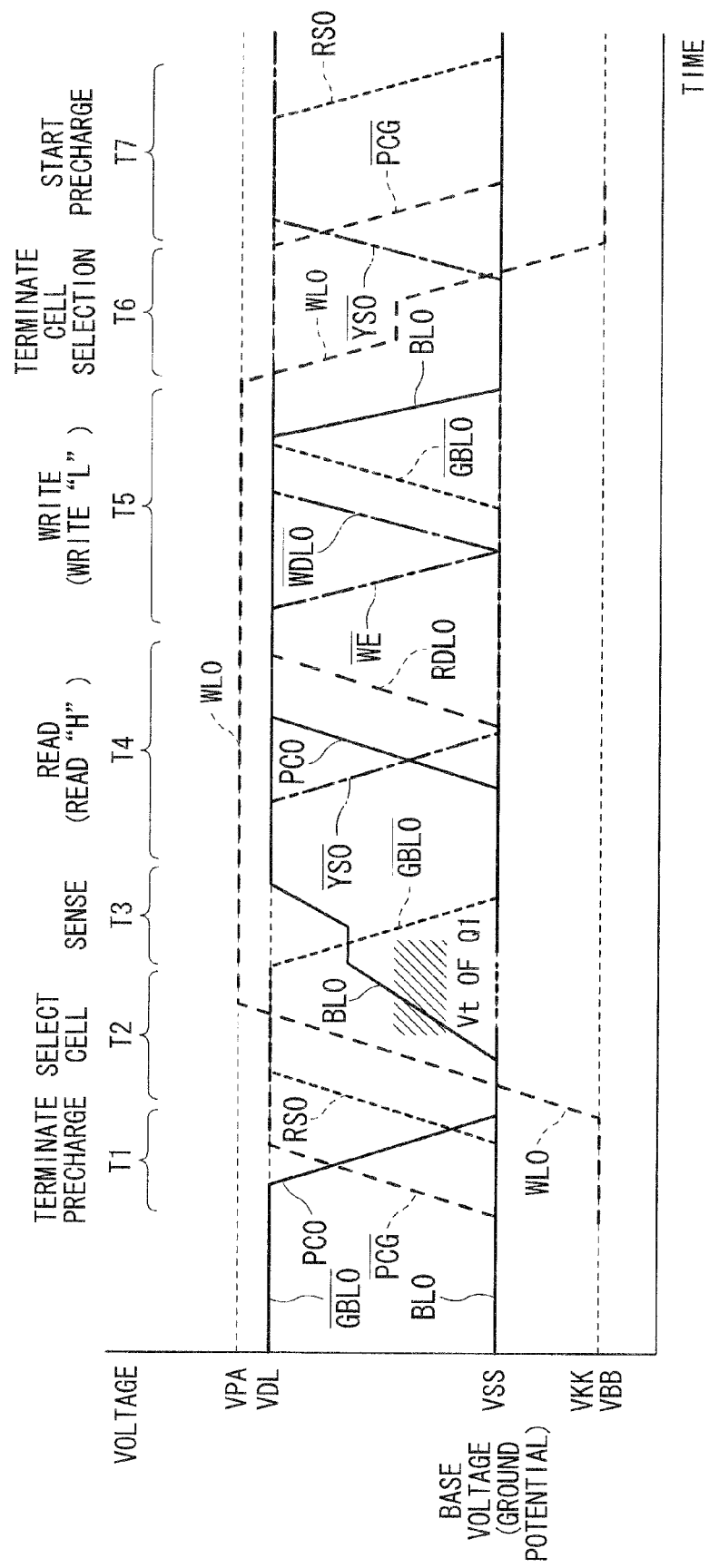
FIG. 3 is a diagram showing the operation waveform of a read operation and a write operation ("H" read and "L" write).

(1) Explanation of the Operation to Read a High Data from a Selected Memory Cell Thereafter to Write a Low Data into the Selected Memory Cell FIG. 3 is a diagram showing the operation waveform of a read operation and a write operation in the circuit configuration shown in FIG. 2.

FIG. 3 shows the waveforms of signals in an operation to first read a High data from a selected memory cell thereafter to write a Low data into the selected memory cell. The entire operation shown in FIG. 3 is divided into seven time periods T1 to T7.

In FIG. 3, the period T1 indicates a precharge termination period, the period T2 indicates a cell select period, the period T3 indicates a sense period, the period T4 indicates a read period, the period T5 indicates a write period, the period T6 indicates a cell select termination period, and the period T7 indicates a precharge start period. Moreover, a voltage VDL indicates a power supply voltage of the memory cell array, a positive voltage VPA and a negative voltage VKK indicate drive voltages for a word line WL_i, and a negative voltage VBB indicates the substrate voltage (see FIG. 1) of the memory cell array.

In this example, the previously described third and fifth voltages respectively correspond to the positive voltage VPA and the negative voltage VKK for the word line, the first voltage corresponds to the voltage VPL for the common plate line, the second voltage corresponds to "VPL-ΔVPL", and the sixth voltage corresponds to the power supply voltage VDL. In addition, the previously described base voltage corresponds to the ground potential VSS.

Referring to FIG. 3, at a time period up to the precharge termination period T1, the bit line BL0 and the global bit line /GBL0 are precharged, and thus the bit line BL0 is a low level and the global bit line /GBL0 is a high level.

In the precharge termination period T1, a precharge signal line PC0 changes from a high level to a low level in order to terminate the precharging of the bit line BL0, and the precharge signal line /PCG changes from a low level to a high level in order to terminate the precharging of the global bit line /GBL0.

In the cell select period T2, the sense amplifier drive control line RS0 corresponding to the selected memory cell array ARRAY_0 is set to a high level. As a result, sense amplifiers SA are activated. In this case, a precharge signal line PC (e.g., PC1) corresponding to a non-selected memory cell array is maintained at a high level, and a sense amplifier drive control line RS (e.g., RS1) corresponding to the non-selected memory cell array is maintained at a low level.

Moreover, the voltage of the selected word line WL0 is increased from the negative voltage VKK to the positive voltage VPA. The negative voltage VKK is set so as to be lower than a low level (ground potential VSS). The positive voltage VPA is set so as to be higher than a high level (the power supply voltage VDL). As a result, a high level signal held in a memory cell disposed at an intersecting point of the word line WL0 and the bit line BL0 is read out. The signal which has been thus read out is input to a sense amplifier SA, and the voltage of the bit line BL0 is increased to a predetermined potential.

At this time, the predetermined potential of the bit line BL0 is set to a voltage above a threshold value range Vt (the hatched part in the figure) of the NMOS transistor Q1. This threshold value range Vt is distributed so as to have a predetermined voltage width which reflects temperature unevenness and process unevenness.

Subsequently, in the sense period T3, the voltage of the global bit line /GBL0 is lowered from a high level to a low level through the NMOS transistor Q1 which has been turned ON. On the other hand, since the PMOS transistor Q2 having the gate terminal to which the global bit line /GBL0 is connected is turned ON, the voltage of the bit line BL0 is amplified from the predetermined potential up to the power supply voltage VDL.

In the read period T4, the select signal line /YS0 connected to a selected global sense amplifier GSA is set to a low level. As a result, the PMOS transistors Q8 and Q10 are turned ON. Thus, the low level of a signal on the global bit line /GBL0 is inverted by the PMOS transistors Q7 and Q8 and the inverted signal is read out. As a result, a high level, which is held in the memory cell, is output to the read data line RDL0. Thus, one read operation of the DRAM is completed. In this case, in the read period T4, the voltage of the precharge signal line PC0 is changed back to a high level. Thus, at times subsequent thereto, the NMOS transistor Q3 is maintained at an ON state. As a result, the PMOS transistor Q2 and the NMOS transistor Q4 function as an inverting circuit.

Next, the operation shifts to a write operation with respect to the same memory cell. First, in the write period T5, the control signal line /WE changes from a high level to a low level. As a result, the PMOS transistor Q9 provided in the global sense amplifier GSA is turned ON, and the write data line /WDL0 is connected to the global bit line /GBL0.

Furthermore, since control is performed such that the voltage of the write data line /WDL0 is set to a high level which is obtained by inverting a low level corresponding to write data, the global bit line /GBL0 changes into a high level. On the other hand, the bit line BL0 changes into a low level as a result of an inverting operation of the PMOS transistor Q2 and the NMOS transistor Q4. Thus, a Low data is written into the selected memory cell through the bit line BL0.

In the cell select termination period T6, the voltage of the selected word line WL0 is lowered from the positive voltage VPA to the negative voltage VKK. Subsequently, the select signal line /YS0 is set to a high level. As a result, the write data line /WDL0 is disconnected from the global bit line /GBL0. Thus, one write operation of the DRAM is completed.

In the precharge start period T7, the precharge signal line /PCG changes into a low level in order to precharge the global bit line /GBL0 for a second time. Thereafter, the sense amplifier drive control line RS0 corresponding to the selected memory cell array ARRAY_0 changes into a low level. As a result, the sense amplifiers SA are deactivated.

Figure 4:
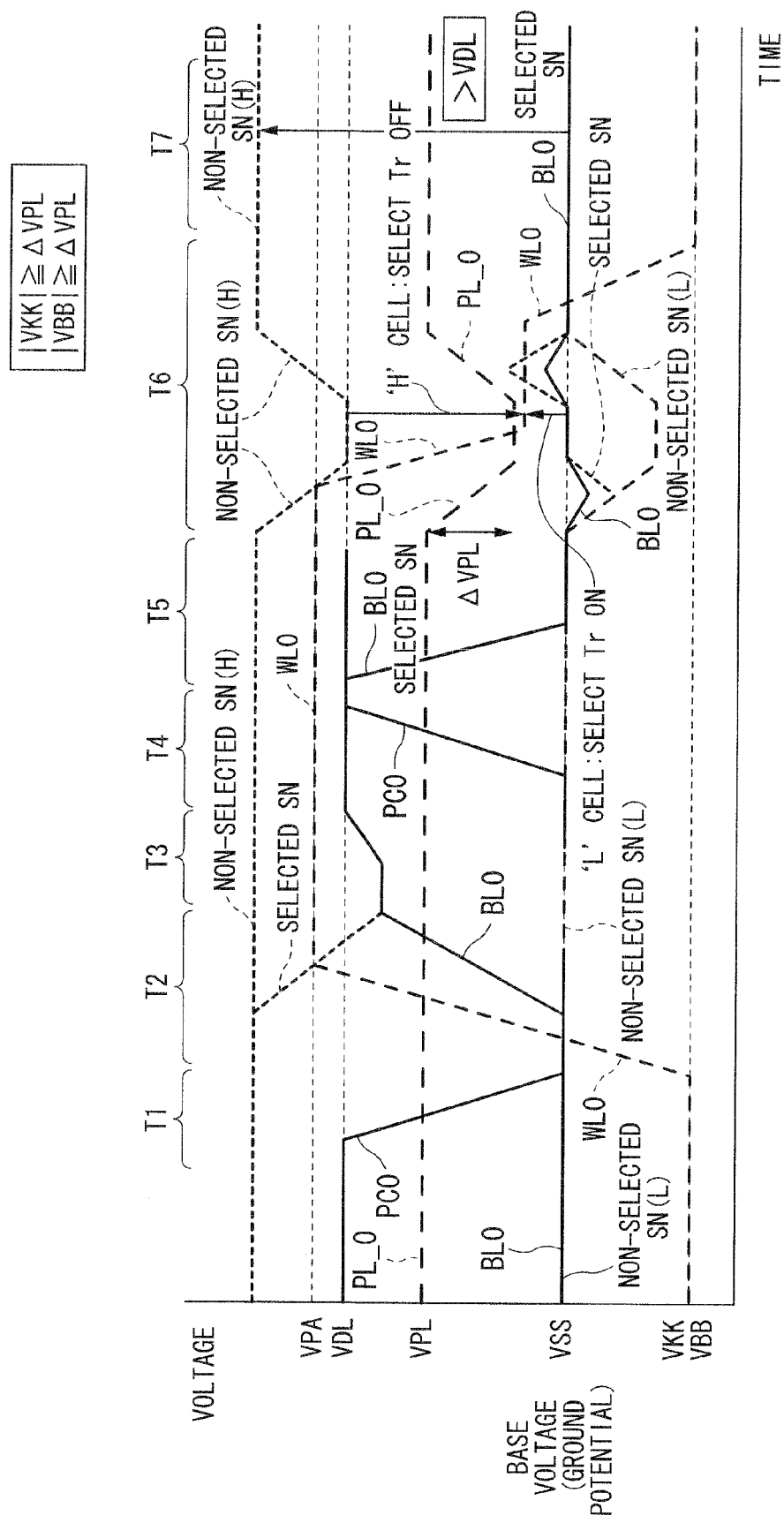
FIG. 4 is a diagram showing the operation waveform of a plate-drive in the read operation and the write operation ("H" read and "L" write).

FIG. 4 is a diagram showing the operation waveform specifically indicating a plate-drive operation in the memory cell array in accordance with the present embodiment shown in FIG. 2. Here, attention is drawn to the operations of a storage node SN of a selected memory cell (which will be hereinafter referred to as "selected SN" as the occasion may demand), a storage node SN(H) of a non-selected memory cell which holds a High data (which will be hereinafter referred to as "non-selected SN(H)"), a storage node SN(L) of a non-selected memory cell which holds a Low data (which will be hereinafter referred to as "non-selected SN(L)"), and the common plate line PL_0 of the memory cell array_0 to which the selected word line belongs.

In FIG. 4 a setting is made such that |VKK| is equal to or greater than $\Delta$VPL and |VBB| is equal to or greater than $\Delta$VPL on the assumption that the ground potential (base voltage) VSS is zero.

Moreover, a setting is made such that, for example, the relation VPL=(VDL+$\Delta$VPL)/2 holds.

In the beginning, a voltage higher than the voltage VDL of the bit line corresponding to a High data is held in a selected SN. In the cell select period T2, when a word line is selected, stored charges are discharged onto the bit line BL0 and thus a high level signal appears on the bit line BL0. After a high level signal is amplified by a sense amplifier SA, a Low data is written into the selected SN in the write period T5.

Thereafter, a cell select termination operation in the cell select termination period T6 is started, and the voltage of the plate line PL_0 is lowered by $\Delta$VPL. As a result, the voltage of the selected SN where a Low data is written and the voltage of the bit line BL0 undergo a coupling, so that these voltages swing in a negative direction. However, since the NMOS transistors Q3 and Q4 of the sense amplifier SA are in an ON state, these voltages return to the ground potential VSS.

Next, the voltage of the word line WL0 is reduced to the intermediate voltage (fourth voltage), and then the voltage of the plate line PL_0 is increased by $\Delta$VPL for a second time to return to the voltage VPL. At this time, the selected SN undergoes a positive coupling. However, since the select transistor Qs is placed in an ON state, the voltage of the selected SN returns to the ground potential VSS for a second time. Subsequently, the voltage of the word line WL0 is reduced to the negative potential VKK, and a Low data is written into the selected memory cell.

The non-selected SN(H) and the non-selected SN(L) undergo a coupling from the plate line PL_0 because the select transistor Qs is in an OFF state at all times. As a result, their voltages are reduced once, but they return to the original voltages. For this reason, there is no change in the quantity of stored charges.

Figure 5:
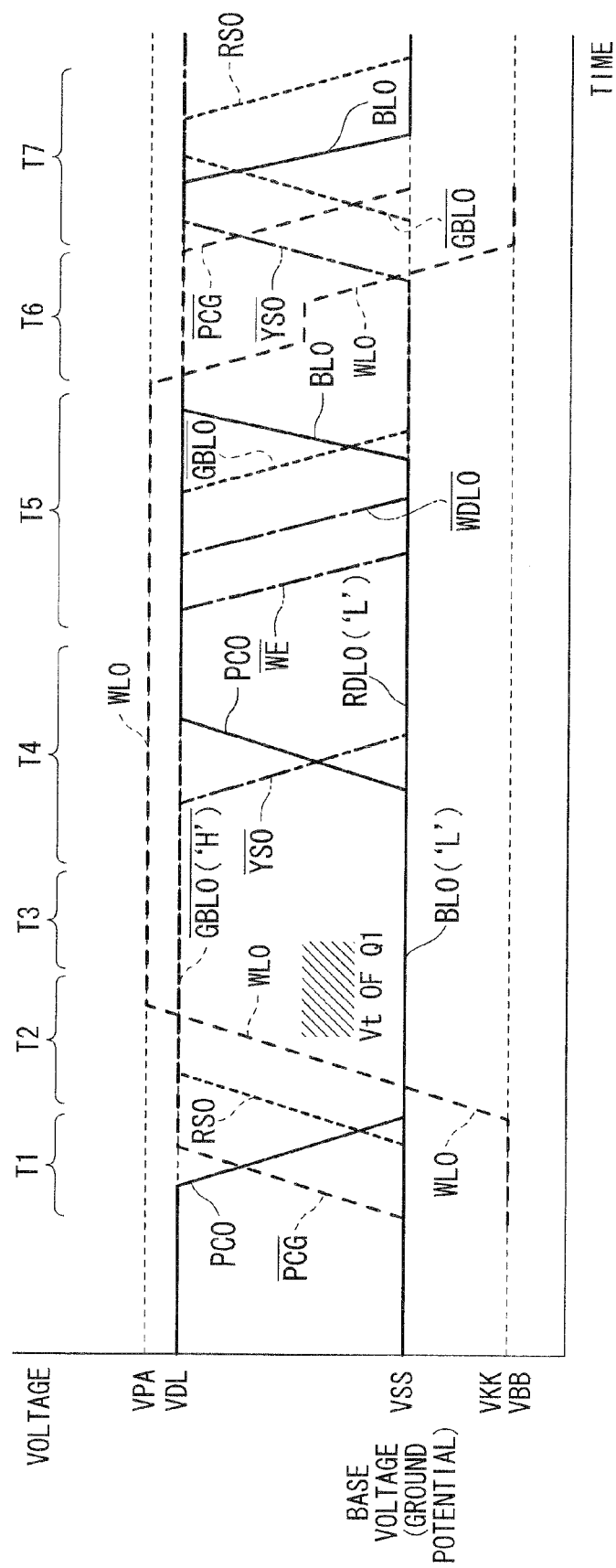
FIG. 5 is a diagram showing the operation waveform of a read operation and a write operation ("L" read and "H" write).

(2) Explanation of the Operation to Read a Low Data from a Selected Memory Cell Thereafter to Write a High Data into the Selected Memory Cell Next, FIG. 5 shows the waveforms of signals in an operation to first read a Low data from a selected memory cell and thereafter to write a High data into the selected memory cell. The fundamental control operation in this case is approximately common to the operation shown in FIG. 3, and only a part of the waveforms of the signals such as a bit line BL0 and a global bit line /GBL0 are different.

Since a Low data of the memory cell is read out in the cell select period T2, the bit line BL0 is maintained at a low level. In the sense period T3, the global bit line /GBL0 is maintained at a high level, which is obtained by inverting a low level of the bit line BL0. Thus, in the read period T4, a low level is output to the read data line RDL0.

Moreover, in the write period T5, since the write data line /WDL0 is changed into a low level, the global bit line /GBL0 changes into a low level, and the bit line BL0 changes into a high level. Furthermore, in the precharge start period T7, the global bit line /GBL0 returns to a high level, and the bit line BL0 returns to a low level. Thus, they are respectively precharged.

Figure 6:
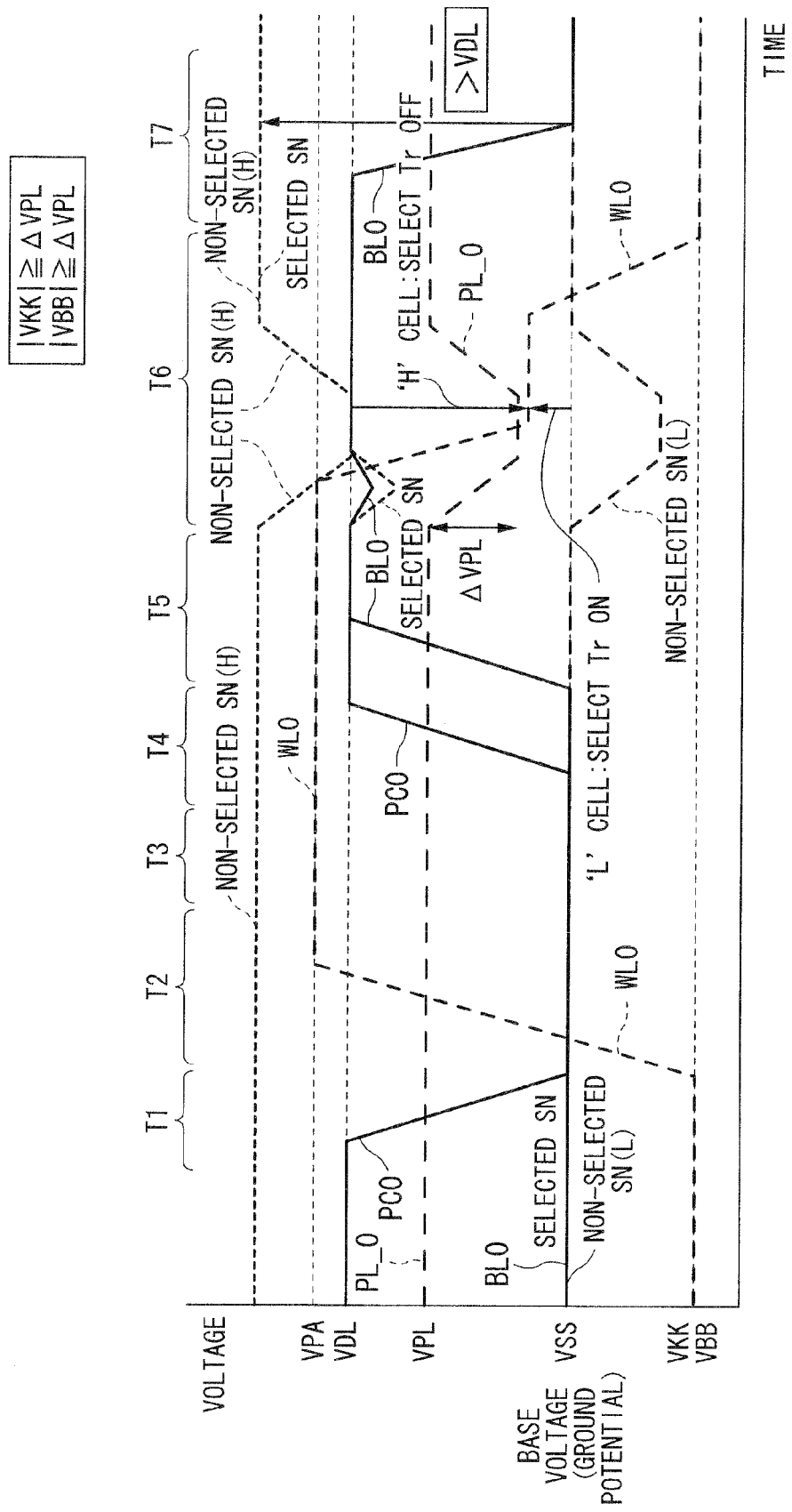
FIG. 6 is a diagram showing the operation waveform of a plate-drive in the read operation and the write operation ("L" read and "H" write).
Figure 7:
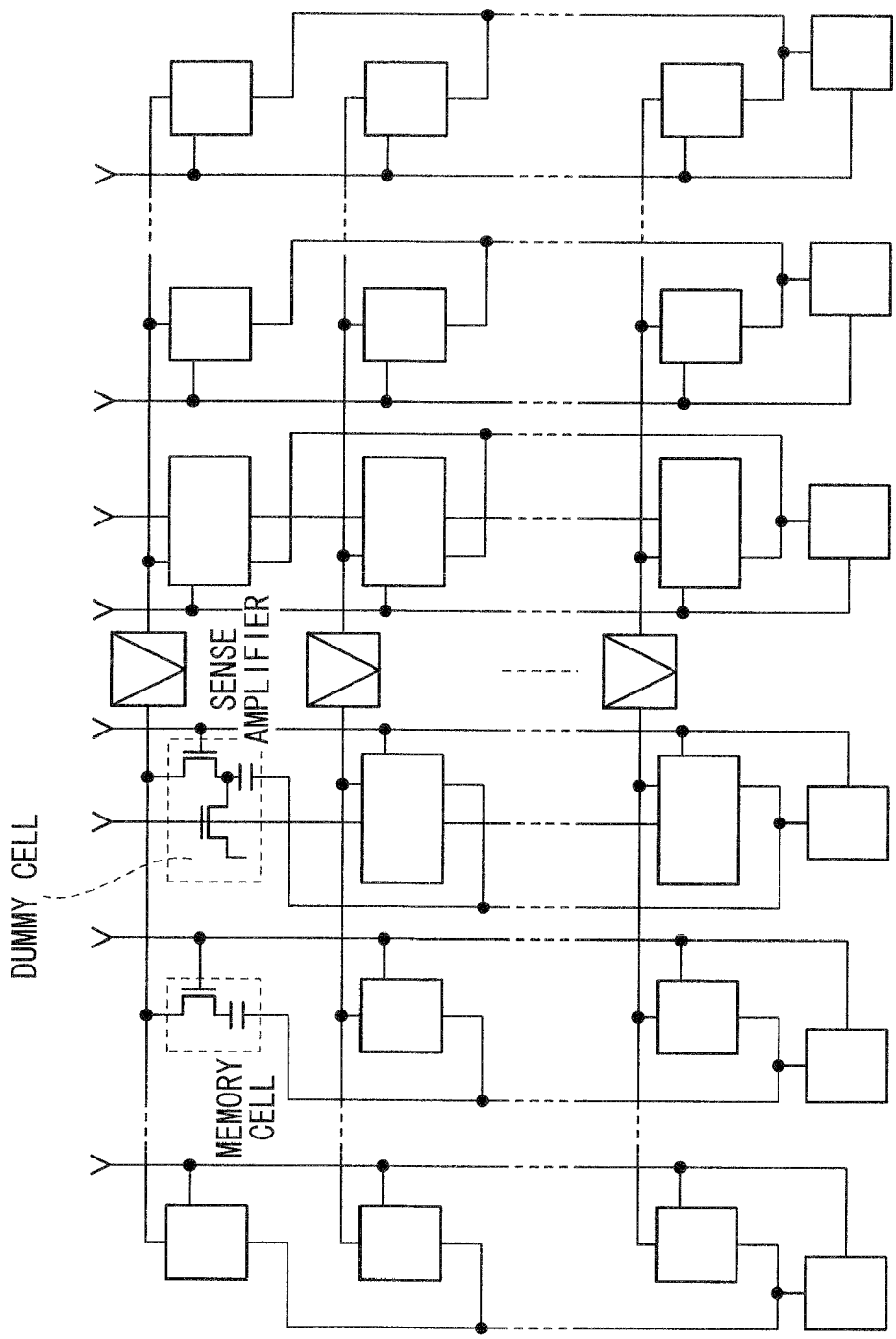
FIG. 7 is a diagram showing an example of a dummy cell in the related art.
Figure 8:
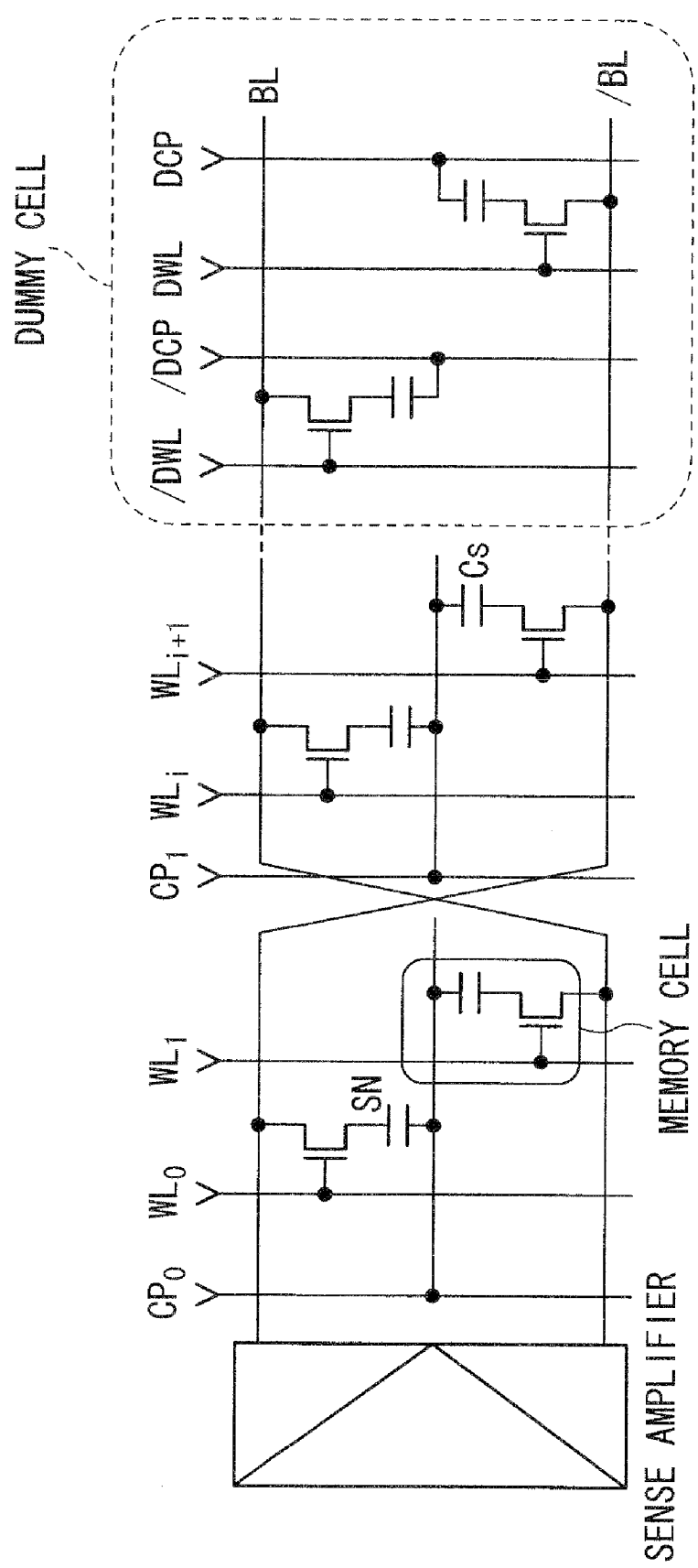
FIG. 8 is a diagram showing another example of a dummy cell in the related art.

FIG. 6 is diagram showing an operation waveform specifically indicating the plate-drive operation of the memory cell array in accordance with the present embodiment shown in FIG. 2. Here, attention is drawn to the operations of the storage node SN of the selected memory cell (selected SN), the storage node SN (H) of the non-selected memory cell which holds a High data (non-selected SN(H)), the storage node SN (L) of the non-selected memory cell which holds a Low data (a non-selected SN(L)), and the common plate line PL_0 of the memory array_0 to which the selected word line belongs.

In the beginning, the ground potential VSS corresponding to a Low data is held at the selected SN. Even when the word line WL0 is selected in the cell select period T2, exchange of charges does not take place because the precharge voltage of the bit line BL0 is equal to the ground potential VSS. For this reason, there is no change in the voltage of the bit line BL0. Resultantly, a low level signal is read out.

Next, in the write period T5, a High data is written into the selected memory cell.

Thereafter, in the cell select termination period T6, the voltage of the plate line PL_0 is reduced by ΔVPL. The selected SN where a High data has been written and the bit line BL0 undergo a coupling, so that the voltages thereof swing in a negative direction. However, since the transistor Q2 of the sense amplifier SA is in an ON state, the voltages thereof return to the power supply voltage VDL.

Next, after the voltage of the word line WL0 is reduced to the intermediate voltage (fourth voltage), the voltage of the common plate line PL_0 is raised by ΔVPL, and thus the voltage of the common plate line PL_0 returns to the voltage VPL.

At this time, since the select transistor Qs is in an OFF state, the selected SN undergoes a positive coupling. As a result, the voltage of the selected SN is increased to a voltage which is higher than the power supply voltage VDL by substantially ΔVPL. Subsequently, the voltage of the word line WL0 is reduced to the negative potential VKK, and a High data is written into the selected memory cell. In this way, a larger quantity of stored charges is written into the memory cell as a High data as compared to the case where stored charges are written by means of an ordinary voltage of VDL. As a result, the operating margin of the DRAM is improved.

The non-selected SN(H) and the non-selected SN(L) undergo a coupling from the common plate line PL_0 because the select transistor Qs is in an OFF state at all times. As a result, the voltages thereof are reduced once and then return to the original voltages. For this reason, there is no change in the quantity of the stored charges.

As described above, in the memory cell array of the present embodiment, the quantity of stored charges of the memory cells can be increased by means of the plate-drive and a simple configuration using single ended sense amplifiers. Moreover, local bit lines can be shortened, and drive load of the plate line can be reduced. Furthermore, since dummy cells are unnecessary, the operating margin of the memory cell array can be improved without increasing the power consumption and/or the chip area. For this reason, lowering of the yield due to defective dummy cells can be avoided. Accordingly, it is possible to improve the operating margin of the DRAM without increasing the cost.

While preferred embodiments of the present invention have been described above, the memory cell array of the present invention is not limited to the above-described illustrated examples, but various changes or modifications may be made within the scope of the invention which does not depart from the gist of the present invention.

What is claimed is:

1. A memory cell array comprising:
    a plurality of word lines;
    a plurality of bit lines intersecting the word lines;
    a plurality of memory cells disposed at intersecting points of the word lines and the bit lines, each of the memory cells including a select MOS transistor and an information charge storage capacitor, the select MOS transistor having a gate electrode connected to a word line, a source electrode, and a drain electrode, one of the source electrode and the drain electrode being connected to a bit line, the other of the source electrode and the drain electrode being connected to one electrode of the information charge storage capacitor, the other electrode of the information charge storage capacitor being connected to a common plate line;
    sense amplifiers respectively connected to the bit lines;
    a device which changes a voltage of the common plate line from a first voltage to a second voltage lower than the first voltage while a word line is a third voltage which makes the word line a selected state; and
    a device which changes a voltage of the word line into a fourth voltage which makes the memory cell a non-selected state and is lower than the third voltage and higher than a fifth voltage which makes the word line a non-selected state, and which changes the voltage of the common plate line from the second voltage to the first voltage after the voltage of the word line has been changed into the fourth voltage.

2. The memory cell array as recited in claim 1, wherein a voltage of the bit line shifts between a base voltage corresponding to a Low data and a sixth voltage which corresponds to a High data, and
    the bit line is precharged to the base voltage before the word line is placed in a selected state.

3. The memory cell array as recited in claim 1, wherein each of the sense amplifiers includes a first NMOS transistor having a gate electrode electrically connected to the bit line, a source electrode to which the base voltage is applied, and a drain electrode electrically connected to an output node of each of the sense amplifiers.

4. The memory cell array as recited in claim 3, wherein the memory cell array is one of a plurality of memory cell arrays which are arranged in a bit line direction, and
    output nodes of sense amplifiers corresponding to bit lines located at the same position in a word line direction among the sense amplifiers included in each of the memory cell arrays are connected to a common global bit line.

5. The memory cell array as recited in claim 4, wherein the global bit line is connected to a global sense amplifier which amplifies a signal on the global bit line and outputs the amplified signal to a read data line, and which amplifies a signal on a write data line and outputs the amplified signal to the global bit line.

6. The memory cell array as recited in claim 5, wherein the number of memory cells electrically connected to each of the bit lines is 64 or less.

7. The memory cell array as recited in claim 1, wherein the voltage of the word line changes into the fourth voltage while the voltage of the common plate line is the second voltage, and after the voltage of the common plate line has changed into the first voltage, the voltage of the word line changes from the fourth voltage to the fifth voltage.

8. The memory cell array as recited in claim 7, wherein the fifth voltage is lower than the base voltage.

9. The memory cell array as recited in claim 8, wherein a difference between the base voltage and the fifth voltage is equal to or larger than a difference between the first voltage and the second voltage.

10. A method of controlling a memory cell array, the memory cell array comprising: a plurality of word lines; a plurality of bit lines intersecting the word lines; a plurality of memory cells disposed at intersecting points of the word lines and the bit lines, each of the memory cells including a select MOS transistor and an information charge storage capacitor, the select MOS transistor having a gate electrode connected to a word line, a source electrode, and a drain electrode, one of the source electrode and the drain electrode being connected to a bit line, the other of the source electrode and the drain electrode being connected to one electrode of the information charge storage capacitor, the other electrode of the information charge storage capacitor being connected to a common plate line; and sense amplifiers respectively connected to the bit lines, the method comprising:

changing a voltage of the common plate line from a first voltage to a second voltage lower than the first voltage while a word line is a third voltage which makes the word line a selected state; and changing a voltage of the word line into a fourth voltage which makes the memory cell a non-selected state and is lower than the third voltage and higher than a fifth voltage which makes the word line a non-selected state and changing the voltage of the common plate line from the second voltage to the first voltage after the voltage of the word line has been changed into the fourth voltage.

* * * * *